United States Patent [19]

Wang

[11] 4,425,423
[45] * Jan. 10, 1984

[54] AUGER MICROLITHOGRAPHY WITH REGARD TO AUGER WINDOW

[76] Inventor: Chia-Gee Wang, P.O. Box 211, Millwood, N.Y. 10546

[*] Notice: The portion of the term of this patent subsequent to Sep. 21, 1999 has been disclaimed.

[21] Appl. No.: 419,405

[22] Filed: Sep. 17, 1982

Related U.S. Application Data

[63] Continuation-in-part of Ser. No. 171,573, Jul. 23, 1980, Pat. No. 4,350,755.

[51] Int. Cl.³ .......................... G03C 5/04; G03C 1/00; G03C 1/02; G03C 5/24
[52] U.S. Cl. ...................................... 430/264; 430/139; 430/296; 430/394; 430/495; 430/604; 430/570; 430/942; 430/967; 250/492.1; 250/492.2
[58] Field of Search ............... 430/139, 394, 966, 967, 430/942, 264, 296, 495, 604, 289, 570; 250/492.1, 492.2

[56] References Cited

U.S. PATENT DOCUMENTS

| | | |
|---|---|---|
| 3,282,697 | 11/1966 | Blank et al. .......................... 430/139 |
| 3,960,560 | 6/1976 | Sato ........................................ 430/5 |
| 3,963,497 | 6/1976 | Kosti ..................................... 430/966 |
| 3,966,473 | 6/1976 | Sato ........................................ 430/5 |
| 4,056,395 | 11/1977 | Sato et al. ............................ 430/323 |
| 4,113,486 | 9/1978 | Sato ...................................... 430/323 |
| 4,119,855 | 10/1978 | Bernacki ......................... 250/492 R |
| 4,177,071 | 12/1979 | Brabardere et al. ............... 430/966 |
| 4,246,328 | 1/1981 | Sato et al. ............................ 430/323 |
| 4,260,670 | 4/1981 | Burns ................................... 430/967 |
| 4,350,755 | 9/1982 | Wang .................................... 430/264 |

Primary Examiner—Richard L. Schilling
Attorney, Agent, or Firm—Hayes, Davis & Soloway

[57] ABSTRACT

An Auger microlithography process wherein a beam of substantially monochromatic X-rays is passed through a photomask to induce Auger electrons from a selected atomic element within a photosensitive layer which Auger electrons act on a material in that layer to cause a physicochemical change thereof and form a latent image. The X-rays used are selected to be substantially monochromatic such that the range of wave lengths falls largely or almost totally within the Auger window, as defined, determined by the particular electron shell of the atomic element to be activated to produce the Auger electrons.

16 Claims, 4 Drawing Figures

AUGER MICROLITHOGRAPHY WITH REGARD TO AUGER WINDOW

RELATED APPLICATION

This application is a continuation-in-part of a copending application by the present inventor, "Auger Microlithography," Ser. No. 171,573 filed July 23, 1980, issued as U.S. Pat. No. 4,350,755 on Sept. 21, 1982.

This invention relates to auger microlithography utilizing substantially monochromatic X-rays.

RELEVANT PRIOR ART

Besides the references and patents disclosed in U.S. Pat. No. 4,350,755 and discussed during prosecution thereof, references are made to more recent articles in the following discussion.

BACKGROUND OF THE INVENTION

The present primary purpose in creating a high resolution pattern in a resist with light, e-beams or X-rays is to use the resulting image as a mask in the fabrication of devices, circuits, and other masks for pattern fabrications. The limit of resolution in such photofabrications depends on the physics of the system as well as on the fabrication techniques. For light photofabrication, diffraction blurring limits working resolution to about one micron. With ultraviolet light, the photon wavelength is slightly reduced and the resolution can be improved to about 0.75 micron. For e-beam lithography, the particle wavelength is very small, but the scattering broadening, particularly the electron back-scattering as from a silicon substrate, becomes a serious problem. In replication of masks, silicon can be replaced by lighter elements as substrates, and the e-beam approach can be most usefully applied.

For X-ray lithography, the particle wavelength is also very small. X-ray resists are electron sensitive, and X-rays are absorbed with the generation of various kinds of electrons which expose the resist in much the same way as an incident e-beam. Photon generated electrons (photoelectrons hereafter) as well as secondary X-rays contribute to the various broadening effects on the pattern and loss of resolution. A photoelectron can have an energy up to that of the incident X-rays and generally has a range of travel shorter than the X-rays for energies of more than a few keV. Photoelectrons tend to register singular latent images in a resist of small silver halide grains, while Auger electrons will create multiple latent images from the emulsion grain itself. In non-silver resists, photoelectrons have limited linear-energy-transfers (the energy deposited in a unit length of material through which the electron travels) while the Auger electrons, being very soft, give very high linear-energy-transfers and thus deposit all their energies in a very small region. Usually the path of travel of an Auger electron is less than 50 A°.

As many as 18 Auger electrons can be generated from a single Auger cascade of an Iodine atom, and as many as 13 Auger electrons from a Bromine atom. These Auger electrons create multiple latent images in a highly concentrated manner in contradistinction to photoelectrons whose latent images are far more disperse.

X-ray photons have much higher energy than light. Every ten fold increase in photon energy generally leads to a reduction of photon absorption cross-section by more than three orders of magnitude. Except for synchrotron radiation sources, conventional X-ray sources can hardly supply the resist with a brightness of more than a small fraction of a millijoule per $cm^2$-sec. Such a weak source requires a long exposure and provides very low throughput in commercial fabrications.

U.S. Pat. No. 4,350,755 teaches the use of relatively monochromatic X-ray of proper energy to induce inner shell ionization of a silver halide (excluding the flourides) resist, leading to a cascade of Auger electrons from the emulsion grain itself to form the desired latent image. The use of silver halide crystal provides a very large amplification factor as the photoreduction of only a few silver atoms of an emulsion grain can lead to the reduction of the entire silver halide crystal to elemental silver in the process of development. The fact that an over-exposed grain would reduce to about the same number of elemental silver atoms gives the silver halide resist a non-linear photosensitivity where the minimum exposure depends only on the grain size. The photoeconomy of this X-ray system is further improved by the selection or concentrating of the X-ray photons to be on an absorption edge of the halide in the resist. Multiple electrons from the grain itself can be induced from a single Auger cascade event. This improved photoefficiency greatly reduces the level of X-ray exposure required to imprint a latent image in the resist, and eliminates the radiation damage to photomasks which can be a very costly factor in a microfabrication processes.

In X-ray lithography, the beam usually consists of photons having a broad range of wavelengths. Secondary fluorescent photons as well as Compton scattered photons are created from the incident photons in the target material. These secondary photons can sensitize the resist with almost the same efficiency as the primary beam, producing an undesired broadening of the pattern image.

In Auger microlithography as here proposed the incident X-ray beam is relatively monochromatic with the photon energy being tuned to a certain photon absorption edge, for example the K or L-edge, of an inner electron shell of the sensitizing atomic element in the resist to be activated to produce the desired Auger electrons. The secondary photons, especially the Compton back-scattered photons, are largely of an energy level below the designated absorption edge and cannot trigger the Auger event. In the process of development, the sensitization by clustered Auger electrons can be distinguished from that of the scattered secondary photoelectrons. The images of the latter outside of the pattern areas can be treated like a background fogging, to be bleached back to a silver halide state for the silver halide resists, or remain undeveloped in a non-silver resist. By developing only the Auger images given by the primary beam, mask dimensions are faithfully reproduced in the resist.

X-rays have been used since their discovery to expose photosensitive materials (see "X-Ray Techniques and Registration Methods" by B. Fay, 1980, in Microcircuit Engineering, edited by Ahmed and Nixon). When irradiating a resist with X-rays, several factors concerning energies and their source need be considered. The preferred spectral region is between 0.37 to 60 A°, especially 2 and 50 A°. Shorter wavelengths make the absorber, typically a gold mask, too transparent and require too large an aspect ratio (thickness to line-width) for fine lines, and longer wavelengths lose too much in absorption by the mask substrate. The spectral range can be extended with the use of heavier masking materials. Heavier elements such as uranium-238, for example, can reduce the thickness needed as compared to gold by one-third or more. An increase in the photon energy brings about, besides changes in the photocross-section, changes in the Auger yield, the Compton yield, and the shift of photon energy from large angle Compton scattering. X-rays can be obtained by synchrotron radiation, X-ray tubes, or radioactive line sources. Different sources produce different spectral intensities and brightnesses and require different capital expenditures, giving differing costs per photon.

For soft X-rays under one keV, the Auger yield (Auger against fluorescent) is high, the Compton yield (Compton scattering against photoabsorption) is low, and the Compton energy-shift at large-angle scatterings (the "Auger window") is small. "Auger window" as here used is a range of photoenergies for the incident X-rays to ionize an inner-shell electron of the sensitizing atomic element and produce the desired auger electrons, whereat the large-angle (80° or larger) Compton scattered X-rays would have energies which fall below the inner-shell absorption-edge and cannot trigger the auger electrons. Requiring small Auger windows, soft X-rays can best be produced by synchrotron radiation where the spectral width can be maintained sufficiently narrow such that the large-angle Compton scattered photons do not have energies above the designated edge of the target atomic element in the resist and avoid the Auger event. With a sufficiently bright synchrotron source, the mask substrate can be thickened to improve its mechanical strength. For harder X-rays, the absorption cross-section is greatly reduced, the Auger yield is reduced, the Compton yield is increased, and the Auger window is increased. In other words, while the broadening by Compton scattered photons becomes important at higher X-rays energies, the Auger window also becomes large so that even with X-ray tubes, a chosen spectral line can be used to irradiate the resist and produce the latent Auger images only from the primary beam. Numerically, with a Compton scattering angle of $\theta \approx 80°$, the Compton wavelength shift, $\delta\lambda = 0.024261(1 - \cos\theta)$, is 0.02 A° and the energy shift, or the Auger window, is 1812 eV at 0.37 A°, 248 eV at 1 A°, 15.5 eV at 4 A°, 3.87 eV at 8 A°, and 0.155 eV at 40 A°.

THE DRAWINGS

This invention will be made clear in the following discussion made by way of example with reference to the drawings in which:

FIG. 1 is a graph illustrating the Auger Window concept;

FIG. 2 is a graph showing how the photon energy breadth of the Auger window changes with photon wavelength;

FIG. 3 illustrates the principles of this invention as applied to a silver halide resist; and FIG. 4 illustrates the principals of this invention as applied to a lead iodide photosensitive layer.

The radiation of the silver bromide by the monochromatic X-rays on the K-edge of the target bromine atomic elements produces inner shell ionization leading to an Auger cascade ejecting electrons from the atomic elements. These electrons result in exposure of the layer by reduction of the silver ions which then can be developed as previously described to form the desired pattern of silver grains suspended in the gelatin matrix. The unexposed silver bromide crystals in the unhardened gelatin in which they are suspended can be dissolved and removed.

Figure 4:
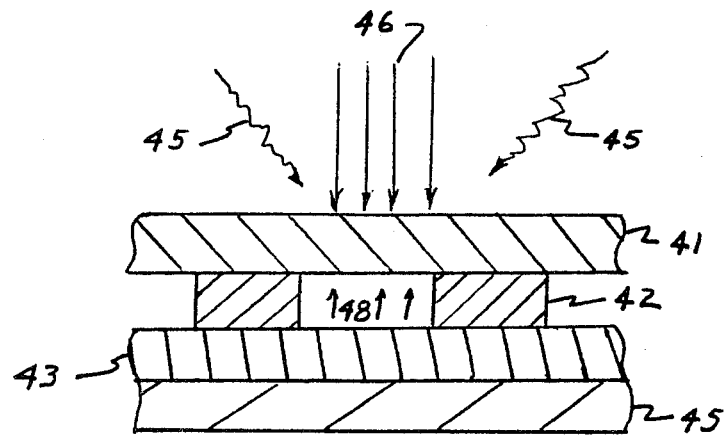
Figure 3:
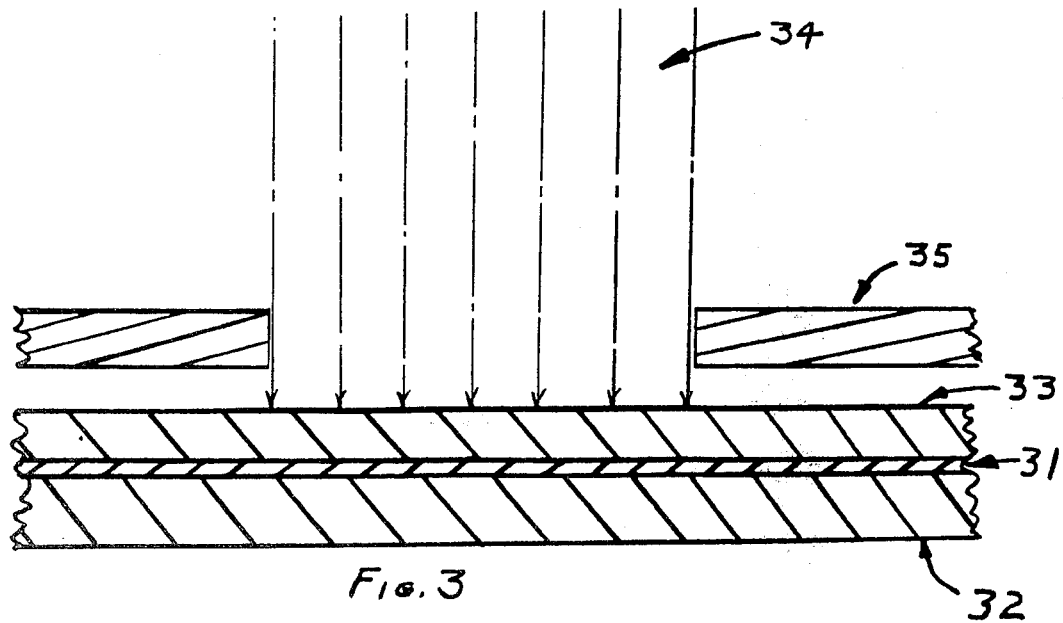
FIG. 3 shows the formation of a photo resist on the silicon wafer. A silicon dioxide layer 31 is formed over a silicon wafer 32 and this dioxide layer is then coated with a photoresist material 33 consisting of silver bromide cyrstals suspended in gelatin. Predetermined areas of layer 33 are then exposed to a relatively monochromatic X-ray beam 34 with the areas of layer 33 not to be exposed being protected by a mask 35. The X-rays 34 are produced in a conventional manner and mask 35 consists of a material opaque to the X-rays utilized, this material being chosen in accordance with the knowledge of the prior art.

FIG. 4 will be more fully described in the following example but it in brief shows a lead iodide layer 43 carried on a suitable surface 44 of aluminum oxide. To develop the image in the lead iodide layer, a mask 42 of a heavy metal such as uranium oxide is placed over the layer 43 on top of which is placed a glass layer 41. The whole of the assembly is exposed to monochromatic X-rays 46 in accordance with this invention along with omni directional blue light 45, as illustrated.

In brief compass, this invention is a method of producing a high resolution latent image pattern. A photosensitive layer of a carrier is prepared having uniformly dispersed therein (a) sensitizing atomic elements capable of absorbing X-rays of a substantially monochromatic wavelength with release of Auger electrons from an inner electron shell thereof, and (b) a material activatable by the Auger electrons to undergo a substantial physicochemical change. A selected portion of the photosensitive layer is exposed to such monochromatic X-rays to form the pattern by inducing the physicochemical change in the material in the selected portion.

The sensitizing atomic elements and the activatable material may be one and the same, or are molecules or materials containing said atomic elements. Sufficient (dependent on the image materials, development procedure etc. this might be at least 30%, 50%, 85% or 95%) of the monochromatic photons have an energy within X eV (electron volts) of the inner edge of the sensitizing atomic element to produce the desired latent image, X being determined by the wavelength of said photons according to the formula:

$$X(eV) = (1.24 \times 10^4/\lambda^2)[0.024261(1 - \cos \theta)] = 248/\lambda^2$$

Where $\theta \simeq 80°$ and $\lambda$ is in $A°$

Figure 1:
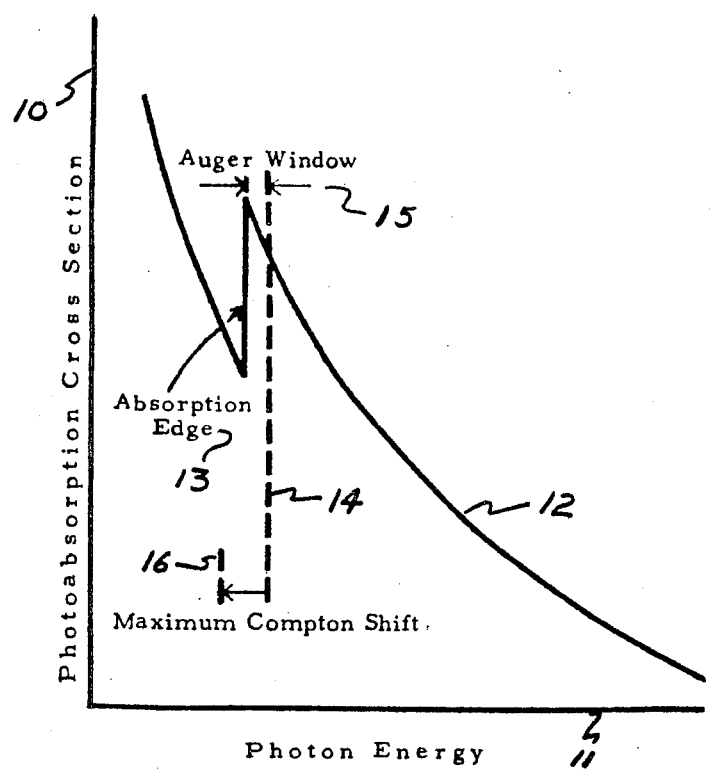
In FIG. 1 the ordinate 11 of the graph gives the photon energy, usually expressed in electron volts eV, and the abscissa is the photoabsorption cross section 10 in cm² per gram. Line 12 shows how the cross section descreases with increases in photon energy. With a particular electron shell of a target atomic element, the photoabsorption cross-section of the electron shell sharply increases at a certain photon energy, the so-called edge, as indicated at 13. Photons mostly strike electrons and are scattered. Those that are not scattered at a wide angle lose little of their energy and retain their incident energy. Those that have a wide angle of scattering, however, lose more of their energy, and will travel through the resist material and strike the designated atomic elements in the resist material outside of the area of the pattern and may still retain sufficient energy to produce Auger electrons outside of the desired pattern. In accordance with this invention then, the resist being irradiated with X-rays is irradiated with X-rays which have only a small amount or no photons that have a high enough energy that when wide-angle scattered, say at an angle of 80° or more, will produce secondary photons having an energy above that of the absorption edge. This is illustrated on the graph by showing that all of the incident photons have energies below that indicated by line 14 so that when they undergo wide-angle Compton scattering to secondary photons the secondary photons will have energies close to line 16 which is below the absorption edge 13 of the target atomic element and can no longer trigger an Auger event of the said edge.
Figure 2:
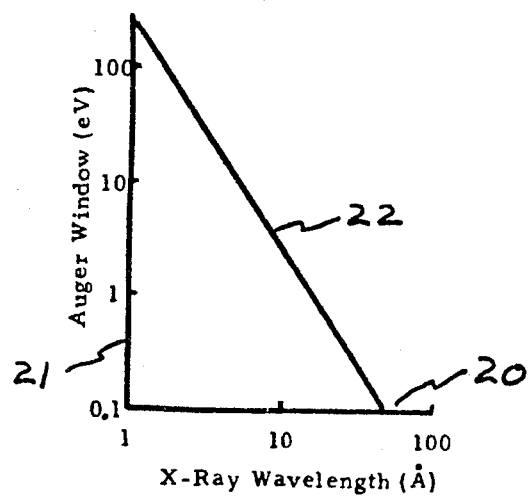
FIG. 2 is a graph wherein both the ordinate 20 and the abscissa 21 are on logarithmic scales. The ordinate expresses the wavelength of the incident photons in Angstroms and the abscissa 21 illustrates how the permitted photon energy in electron volts to satisfy the Auger window concept whose width rapidly decreases as the wavelength of the incident photons increases.

The Auger window being inclusive of photons having energies above the inner (absorption) edge the sensitizing atomic element up to the photon energy whereat the Compton photons at a scattering angle of 80° or more have an energy not exceeding the said absorption edge. The X-rays can first be passed through an absorber that removes photons having energies greater than the upper limit of the Auger window (line 14 in FIG. 1). It is desirable for the photosensitive layer to be substantially free of any other atomic elements capable of absorbing the secondary X-ray photons with the generation of Auger electrons beyond the designated area.

By way of examples, the above referred to carrier, sensitizing atomic element and material can be selected from the group consisting of the following combinations:

| Carrier | Sensitizing Atomic Element | Material |
|---------|---------------------------|----------|
| Gelatin | Cl, Br, I | Silver Halide Crystal |
| Gelatin | Ag | Silver Halide Crystal |
| Dichloracrylates | Cl | Dichloracrylates |
| None | Cl, Br, I | Lead Halide |
| None | Pb | Lead Halide |
| Gelatin | Cr | Dichromate Coating |

EXAMPLES

Following are specific examples of how suitable essentially monochromatic X-rays can be produced and used in a manner to satisfy the Auger window concept of this invention. With a silver iodide resist, the iodine (I) K-edge at 33.1665 keV can be irradiated with the $K\alpha_1$ of a Lanthanium (La) target at 33.442 keV. The fluorescent and the Compton scattered photons at large-angles therefrom are below the Iodine K-edge. The $K\alpha_2$ of Lanthanium is below the K-edge of Iodine and the less intense $K\beta$ lines of Lanthanium can be preferentially absorbed by the K-edge of a thin Barium element. If silver (Ag) is used for the generation of Auger electrons in a silver halide resist, the K-edge of Silver at 25.5165 keV can be irradiated by the $K\alpha$ lines of Antimony (Sb) at 26.36 and 26.11 keV, assuring an Auger window covering more than the $K\alpha$ of Sb and the K-edge of Ag. The weaker $K\beta$ lines of Sb can be deleted by the K-edge of a thin Tin (Sn) absorber. Similarly, with the K-edge of Bromine (Br) at 13.47 keV for a AgBr resist, the target spectral line can be the $L\alpha_1$ of Uranium at 13.6147 keV, and the deletion absorber can be a thin layer of Gold for its $L_{II}$ edge at 13.736 keV.

For soft X-rays of a few keV or less, the Auger window becomes narrow and the generation of the X-rays by tubes becomes increasingly difficult for sufficient brightness. The Bromine $L_{II}$-edge of 1.599 keV for a AgBr resist, for example, can be irradiated with the $M\xi_1$ line of a Platinum (Pt) target plus a Selenium (Se) window. Synchrotron radiations can perhaps better cover this spectral region. A well designed X-ray tube with Palladium (Pd) target can still be sufficiently bright to irradiate a AgCl resist on the Chlorine (Cl) K-edge at 2.8196 keV with the $L\alpha_2$ line of Pd at 2.83329 keV, and use the $L_{III}$ edge of Ruthenium to delete the $L\alpha_1$ line of Pd, which will be outside the Auger window of the Chlorine K-edge.

The largest body of information regarding photosensitive materials exists for the silver halide compounds. For a general review, see "Photograph," 17, 611, Encyc. Chem. Tech., 1982; for photomasks with silver halides, see a recent series of U.S. Pat. Nos. by Sato et al.: 3,960,560; 3,966,473; 4,056,395; 4,113,486; and 4,246,328; and for some simplified steps in development and fixation, see U.S. Pat. Nos. 3,963,497 by Kosti; 3,179,517 by Tregillus et al.; 3,260,598 by Yutzy et al.; and 3,212,896 by Yudelson et al. From a few photoreduced silver atoms in an emulsion grain, an entire silver halide crystal can be reduced to elemental silver by development. This multiplication of the sensitized silver is particularly important for X-rays with low brightness. Unfortunately, a high resolution requires the exposure of pixels at very small dimensions, which limits the grain size of an emulsion, and thereby the desired large amplification factor. Also, except for a direct mask replication, the elemental silver images must be further treated to bring in the desired etching characteristics. Every additional step in processing reduces throughout.

When a silver halide emulsion grain is sensitized, silver is reduced to a metallic form and trapped at the sensitivity speck. During development, the surface of, for example, an AgBr grain is negatively charged, gives a lower charge barrier to the absorption of the developing species, and initiates contact for further chemical reduction. Metallic silver begins to form a lattice, and to conduct electrons deep from the lattice for further reduction, forming a silver network as the center of an auto-catalytic process. This continues until all the silver ions in the grain are reduced. The remaining silver halide is removed in fixation. The amount of silver reduced in development varies a great deal even if all the emulsion grains begin with the same size. The grains with many sensitized points develop at a much faster rate and easily complete the reduction process long before the grains with a few or no sensitized points.

After unreduced silver halide crystal is removed in fixation, the silver images, or the silver density of an image, can be separated into regions of fog, toe, shoulder and the main body. Reducing such as with the cutting reducers, reduce the density in the toe and the fog region more than in the saturation region, and therefore enhance the contrast. Cutting reducers bring out the Auger images. Other reducers such as proportional reducers which lower the density proportionally, and thus reduces the contrast, or subtractive reduces which reduce the density equally over the exposure scale and do not alter the contrast, are not as useful to bring out the Auger images. Reductions generally involve chemical oxidation of some of the elemental silver images followed by or concurrent with fixation. Ferricyanide is a commonly used oxidant. The reduction can also be concurrent with development. Adding bromide, such as 0.5 gram of potassium bromide per liter to a developer such as hydroquinone, can cut the fog by one-half with a short development time without any perceptible change in the image density. A further increase in the bromide concentration cause a lowering in both the main images and the fog and toe densities, but the latter are lowered to a greater amount. Reduction of fog and toe densities to enhance the Auger images can be concurrent in both the development and the fixation.

Once an Auger image of elemental silver is formed, it can be treated in a variety of ways to bring about the desired characteristics for subsequent processes. These treatments are well known in the art of photofabrication. The density of the silver image, for example, can be intensified by adding a metal such as mercury, chromium, copper, or silver itself, and thus make the Auger image an element of the replicated mask. In place of the silver image, dyes of various chemical properties can be introduced. The gelatin matrix of the emulsion can be made a protective shield for chemical etching. Development with pyrogallol, for example, forms locally an insoluble gelatin product of brown oxidate in place of the silver image, while gelatin with an unexposed silver halide is thereafter easily dissolved. The gelatin image can be further hardened by certain acids to suck out its water, or by organic compounds to link up adjacent gelatin chains, or simply by baking. For high resolution lithography, the silver halide emulsion must be made of very small grains, typically at one-fifth or less of the designated line resolution. The photosensitive emulsion can be whirl coated to a very thin layer, about as thin as the designated line resolution. Some gelatin compounds, such as the ammonium dichromate coated gelatin, can form gelatin image without silver grains, but this involves polymerization without the amplification of silver crystals.

Non-silver resists generally do not provide a large amplification factor of photosensitivity in the development, but they do offer simplified steps in the subsequent processing. In recent years, photosensitive polymers have been in the main materials used for non-silver resists (See "Photoreactive Polymers," 17, 680, Encyc. Chem. Tech., 1982). The fact that such resists are themselves electron sensitive, and the X-ray photons are absorbed with the generation of various kinds of electrons that sensitize the resist, particularly the low energy electrons whose large linear-energy-transfer give highly localized exposure, all e-beam resists can in principle be used as Auger resist as herein proposed. To enhance the X-ray sensitivity, heavy elements are often added to the light organic polymers. Chlorine, for example, dopes into acrylate and forms a dichloroacrylate which when irradiated with the Pd-L line photons has proved to be quite sensitive. The resolution of the polymer, however, is only one micron, well above the shot-noise limited dimension. For Auger microlithography, only Auger electrons from the designated element are allowed to form images, and in the case of Chlorine to be irradiated by the Pd-L line photons, the $L\alpha_1$ must be deleted, as it falls outside the Auger window of the Chlorine K-edge.

When a resist is irradiated by an e-beam or an ion-beam, the beam energy decreases continuously in the resist, therefore the spectral window of the beam cannot be narrow. X-ray photons, on the other hand, retain their energy but the flux thereof reduces as they travel deep into the resist. The Auger mode of resist-sensitizing for the silver halide emulsion as well as for the non-silver material share the same three functions, i.e. expose the Auger image with the highly concentrated soft electrons, avoid the development of scattered images of the secondary photoelectrons, and irradiate the resist with a spectral width within the Auger window to avoid the Auger cascade from large-angle Compton scattered photons outside of the pattern areas. For the photopolymers in general, once the Auger images are registered, their process of development is very similar to that of the usual e-beam or the X-ray lithography, well known in the art.

Besides photopolymers and silver halides, there are other photosensitive compounds that can provide an Auger image in an indirect manner. FIG. 4 illustrates the use of the inorganic salt lead iodide, $PbI_2$. $PbI_2$ can be evaporated on a substrate 44 such as Si, $Si_3N_4$, or $Al_2O_3$ to a highly uniform thickness of 75 nm. This resist layer 43 is not sensitive to light at room temperature but becomes photosensitive to blue and blue-green light at temperatures near 200° C. At such temperatures, $PbI_2$ begins to photodissociate into metallic lead and molecular iodine, and they in turn recombine into $PbI_2$ in a dynamic equilibrium. When local energy is supplied to the iodine molecules, however, they evaporate as indicated at 48 and leave behind the metallic lead. From a window 42 of heavy matter, the blue light 45 as well as the X-rays 46 irradiate the resist, with the blue light (largely in the range of 3500 A° to 5500 A°) shining from several directions to avoid or reduce diffraction variations. For X-rays with an energy within the designated Auger window, the X-ray photons induce Auger electrons from the resist material largely confined to the beam dimensions. The Auger electrons are very soft, and deposit their energies mostly within a very small area from their points of creation at much less than 50 A°. Receiving the Auger electrons, the Iodine molecules evaporate from the resist and leave behind a negative colloidal image of metallic Lead. The desired Lead pattern can be generated in several incremental steps if necessary. The unreacted lead iodide is easily washed away with an alkali solution. Lead is heavier than gold, and makes an inexpensive negative mask. Other photosensitive lead halides such as $PbBr_2$ and $PbCl_2$ can be employed in a manner similar to that of $PbI_2$.

What is claimed is:

1. A method of producing a high resolution latent image pattern, comprising:

preparing a photosensitive layer of a carrier having dispersed therein (a) sensitizing atomic elements capable of absorbing X-rays of a substantially monochromatic wavelength with release of Auger electrons from an inner shell ionization thereof, and (b) a material activatable by said Auger electrons to undergo a physicochemical change, and exposing a selected portion of said layer to from said pattern to X-rays of said substantially monochromatic wavelength to thereby induce said physicochemical change in said material in said pattern.

2. The method of claim 1 wherein sufficient of the X-rays exposing said selected portion have an energy within the range of the Auger window of said sensitizing atomic element to produce the desired latent image.

3. The method of claim 2 wherein said X-rays exposing said select portion have an energy exceeding x electron volts (eV) of an inner edge of said sensitizing atomic element, x being determined by the wavelength $\lambda(A°)$ of said X-rays according to the formula $x = 248/\lambda^2$.

4. The method of claim 3 wherein the Auger window includes X-rays up to the energy whereat the Compton photons at a scattering angle of 80° or more have an energy not exceeding that of the said inner edge.

5. The method of claim 1 wherein said X-rays have a wavelength in the range of 0.37 to 60 A° and sufficient of said X-rays exposing said selected portion have an energy within the Auger window of said sensitizing atomic element to produce the desired latent image, said Auger window being inclusive of X-rays having energies at an inner edge of said sensitizing atomic element up to the photon energy whereat the Compton scattered photons at a scattering angle of 80° or less have an energy equal to or exceeding that of said inner edge.

6. The method of claim 4 wherein said X-rays are obtained from an X-ray source and first pass through an absorber that removes preferentially X-rays having energies greater than the range for said Auger window.

7. The method of claim 6 wherein the source is a synchrotron.

8. The method of claim 4 wherein said pattern is determined by a mask interposed between the source of said X-rays and said photosensitive layer, wherein said photosensitive layer is substantially free of any other atomic elements capable of absorbing secondary photons with the generation of Auger electrons, and wherein said latent image pattern is developed to produce a photoresist.

9. The method of claim 4 wherein said carrier, sensitizing atomic element and material are selected from the group consisting of the following combinations:

| Carrier | Sensitizing Atomic Element | Material |
| --- | --- | --- |
| Gelatin | Cl, Br, I | Silver Halide Crystal |
| Gelatin | Ag | Silver Halide Crystal |
| Dichloracrylates | Cl | Dichloracrylates |
| None | Cl, Br, I | Lead Halide |
| None | Pb | Lead Halide |
| Gelatin | Cr | Dichromate Coating |

10. The method of claim 4 wherein said photosensitive layer comprises essentially lead halide selected from the group comprising Chloride, Bromide and Iodide on a surface, said lead halide, while being exposed to said X-rays, also being heated and being simultaneously exposed to light inclusive of a substantial amount having a wavelength of 3500–5500 A°.

11. The method of claim 10 wherein the light is omnidirectional.

12. The method of claim 4 wherein said photosensitive layer is a thin layer on a silicon wafer and comprises a gelatin with silver halide crystals therein, the halide being selected from the group comprising Chloride, Bromide and Iodide.

13. The method of claim 1 wherein said carrier and material is a dichloroacrylate and said sensitizing atomic element is chlorine.

14. The method of claim 6 wherein said absorber is selected from the group consisting of Barium, Tin, Gold, Selenium and Ruthenium.

15. The method of claim 6 wherein said absorber and said inner shell are selected from one of the following combinations: Barium/Iodine —K; Tin/Silver —K; Gold/Bromine —K; Selenium/Bromine —$L_{II}$; and Ruthenium/Chlorine —K.

16. The method of claim 6 wherein the target source of said X-rays, said absorber and said inner electron shell are selected from one of the following combinations:

| Target Source | Absorber | Electron Shell |
| --- | --- | --- |
| Lanthamium | Barium | Iodine-K |
| Antimony | Tin | Silver-K |
| Uranium | Gold | Bromine-K |
| Platinum | Selenium | Bromine-$L_{II}$ |
| Palladium | Ruthenium | Chlorine-K |

* * * * *